(12) United States Patent
Liang et al.

(10) Patent No.: US 12,482,738 B2
(45) Date of Patent: Nov. 25, 2025

(54) SYSTEMS AND METHODS FOR DIMENSIONING A LAND GRID ARRAY PAD

(71) Applicant: Advanced Micro Devices, Inc., Santa Clara, CA (US)

(72) Inventors: ChangWei Liang, Shanghai (CN); Sanjay Dandia, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 203 days.

(21) Appl. No.: 18/502,193

(22) Filed: Nov. 6, 2023

(65) Prior Publication Data
US 2025/0149428 A1    May 8, 2025

(51) Int. Cl.
*H01R 12/71* (2011.01)
*H01L 21/48* (2006.01)
*H01L 23/498* (2006.01)

(52) U.S. Cl.
CPC .... *H01L 23/49838* (2013.01); *H01L 21/4846* (2013.01); *H01R 12/714* (2013.01)

(58) Field of Classification Search
CPC .................................................. H01R 12/714
See application file for complete search history.

(56) References Cited

U.S. PATENT DOCUMENTS

2018/0358770 A1* 12/2018 Light ................ H01R 43/18

* cited by examiner

*Primary Examiner* — Sherman Ng
(74) *Attorney, Agent, or Firm* — Greenberg Traurig, LLP

(57) ABSTRACT

A method for dimensioning a land grid array pad can include forming an initial landing area of a land grid array pad, wherein the initial landing area is dimensioned to cause at least a majority of a landing surface of one or more socket pins to land off of the initial landing area prior to actuation of one or more sockets including the one or more socket pins. The method can also include forming a final landing area of the land grid array pad, wherein the final landing area is dimensioned to maintain electrical contact with the landing surface of the one or more socket pins after actuation of the one or more sockets including the one or more socket pins. Various other methods and systems are also disclosed.

20 Claims, 10 Drawing Sheets

SYSTEMS AND METHODS FOR DIMENSIONING A LAND GRID ARRAY PAD

BACKGROUND

An integrated circuit package includes a block of semiconductor material encapsulated in a supporting case that prevents physical damage and corrosion. The case, known as a package, supports the electrical contacts which connect the device to a printed circuit board. Some integrated circuits can connect to the printed circuit board by pads that can be implemented as contacts of a land grid array (LGA). Printed circuit boards can include pads such as anti-pads implemented in internal layers.

The LGA is a type of surface-mount packaging for integrated circuits (ICs) that provides a grid of contacts (e.g., pads or lands) on the underside of a package. An LGA package can be electrically connected to a printed circuit board (PCB) either by the use of a socket or by soldering directly to the board. The LGA package is notable for having pins on a socket (i.e., when a socket is used) rather than an integrated circuit.

An anti-pad in a printed circuit board (PCB) refers to a void area around a plated through hole (PTH) on an internal plane layer of the PCB. The anti-pad restricts other signal traces that should not be connected to that particular PTH. Both pads and anti-pads can exhibit parasitic capacitance that can detrimentally affect operation of the circuit in which they are implemented.

The term "parasitic capacitance," as used herein, can generally refer to an unavoidable capacitance that exists between the parts of an electronic component or circuit because of their proximity to each other. For example, and without limitation, parasitic capacitance can refer to internal capacitance of any practical circuit element, such as an inductor, diode, transistor, etc. Internal capacitance can cause the behavior of circuit elements to depart from that of ideal circuit elements.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Figure 1:
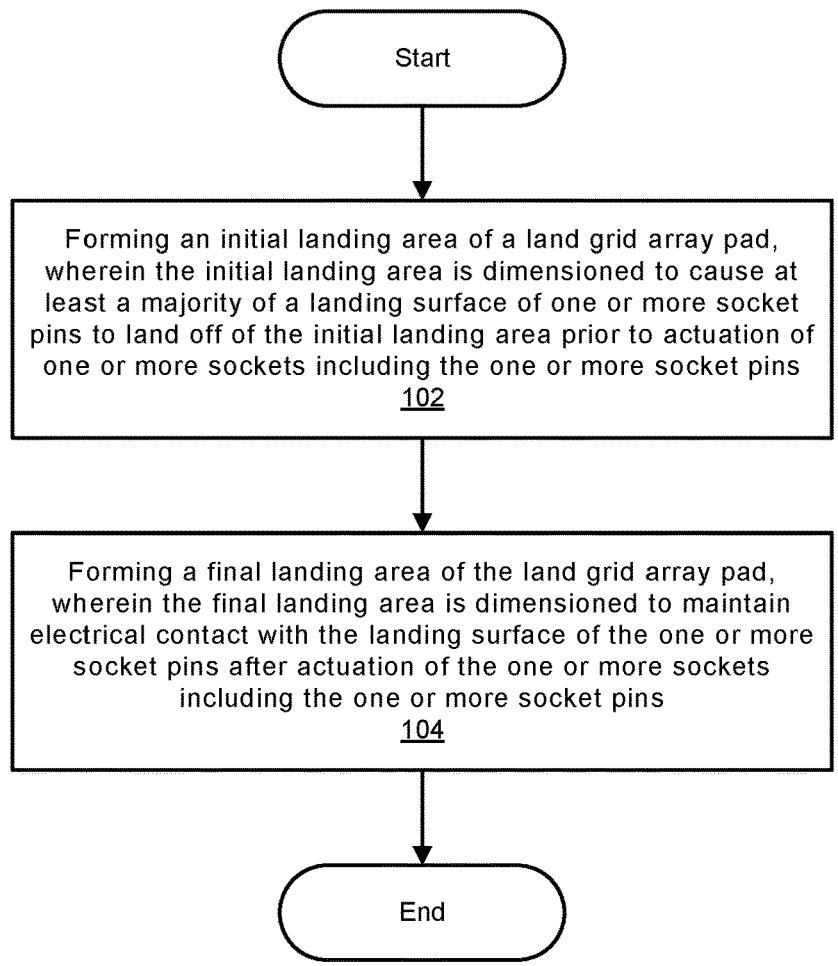
FIG. 1 is a flow diagram of an example method for dimensioning a land grid array pad.

Throughout the drawings, identical reference characters and descriptions indicate similar, but not necessarily identical, elements. While the examples described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to systems and methods for dimensioning a land grid array pad. For example, a land grid array pad can be formed so that an initial landing area of the pad is dimensioned to cause at least a majority of a landing surface of one or more socket pins to land off of the initial landing area prior to actuation of one or more sockets including the one or more socket pins. Additionally, the land grid array pad can be formed so that a final landing area is dimensioned to maintain electrical contact with the landing surface of the one or more socket pins after actuation of the one or more sockets including the one or more socket pins. In some implementations, all final landing areas of all land grid array pads of a land grid array can be dimensioned to maintain electrical contact with landing surfaces of all socket pins of a socket after actuation of the socket. By reducing the initial landing area so that some socket pins of some types of sockets can initially land off of (e.g., mostly off of and/or entirely off of) the land grid array pad, dimensions of the land grid array pad can be reduced while still being compatible with various socket and pin configurations provided by different socket suppliers (e.g., a variety of legacy sockets and/or future socket designs). Reduction of the land grid array pad dimensions in this manner allows for reduction of a corresponding anti-pad in the semiconductor device package without impacting socket-CPU interaction, thus reducing parasitic capacitance (e.g., capacitive load) and, consequently, improving semiconductor device functionality.

The following will provide, with reference to FIG. 1, detailed descriptions of example methods for dimensioning a land grid array pad. Detailed descriptions of example methods for determining dimensions of a land grid array pad will also be provided in connection with FIG. 2. In addition, detailed descriptions of example sockets including example socket pins will be provided in connection with FIGS. 3-5.

In one example, a land grid array pad can include an initial landing area dimensioned to cause at least a majority of a landing surface of one or more socket pins to land off of the initial landing area prior to actuation of one or more sockets including the one or more socket pins, and a final landing area dimensioned to maintain electrical contact with the landing surface of the one or more socket pins after actuation of the one or more sockets including the one or more socket pins.

Another example can be the previously described example land grid array pad, wherein the one or more sockets include a majority of all sockets with which a land grid array including the land grid array pad is configured to be compatible.

Another example can be any of the previously described example land grid array pads, wherein the one or more sockets include all sockets with which a land grid array including the land grid array pad is configured to be compatible.

Another example can be any of the previously described example land grid array pads, wherein the one or more sockets include a plurality of different socket and pin configurations.

Another example can be any of the previously described example land grid array pads, wherein the initial landing area has dimensions causing an entirety of a landing surface of the one or more socket pins to land off of the initial landing area prior to actuation of one or more sockets including the one or more socket pins.

Another example can be any of the previously described example land grid array pads, wherein the one or more sockets include a majority of all sockets with which a land grid array including the land grid array pad is configured to be compatible.

Another example can be any of the previously described example land grid array pads, wherein the one or more sockets include all sockets with which a land grid array including the land grid array pad is configured to be compatible.

Another example can be any of the previously described example land grid array pads, wherein the one or more sockets include a plurality of different socket and pin configurations.

Another example can be any of the previously described example land grid array pads, wherein the land grid array pad is arranged in a land grid array on a first surface region of a side of a semiconductor device package substrate, the land grid array includes an additional land grid array pad arranged on a second surface region of the side of the semiconductor device package substrate, and the additional land grid array pad includes an additional initial landing area having dimensions causing at least a majority of a landing surface of an additional socket pin of the one or more socket pins to land off of the additional initial landing area prior to actuation of the one or more sockets.

In one example, a land grid array can include a first plurality of land grid array pads arranged on a first surface region of a side of a semiconductor device package substrate and a second plurality of land grid array pads arranged on a second surface region of the side of the semiconductor device package substrate, wherein land grid array pads of the first plurality of land grid array pads and the second plurality of land grid array pads have initial landing areas and final landing areas, the initial landing areas have dimensions causing at least a majority of landing surfaces of a plurality of socket pins to land off of the initial landing areas prior to actuation of one or more sockets including the plurality of socket pins, and the final landing areas have dimensions configured to maintain electrical contact with the landing surfaces of the plurality of socket pins after actuation of the one or more sockets including the plurality of socket pins.

Another example can be the previously described example land grid array, wherein the plurality of socket pins includes a first set of socket pins configured to wipe, by actuation of the one or more sockets, in a first direction onto final landing areas of the first plurality of land grid array pads, and a second set of socket pins configured to wipe, by actuation of the one or more sockets, in a second direction opposite the first direction onto final landing areas of the second plurality of land grid array pads.

Another example can be any of the previously described example land grid arrays, wherein the one or more sockets include a majority of all sockets with which the land grid array is configured to be compatible.

Another example can be any of the previously described example land grid arrays, wherein the one or more sockets include all sockets with which the land grid array is configured to be compatible.

Another example can be any of the previously described example land grid arrays, wherein the one or more sockets include a plurality of different socket and pin configurations.

Another example can be any of the previously described example land grid arrays, wherein the initial landing areas have dimensions causing entireties of landing surfaces of the plurality of socket pins to land off of the initial landing areas prior to actuation of the one or more sockets including the plurality of socket pins.

In one example, a method can include forming an initial landing area of a land grid array pad, wherein the initial landing area is dimensioned to cause at least a majority of a landing surface of one or more socket pins to land off of the initial landing area prior to actuation of one or more sockets including the one or more socket pins, and forming a final landing area of the land grid array pad, wherein the final landing area is dimensioned to maintain electrical contact with the landing surface of the one or more socket pins after actuation of the one or more sockets including the one or more socket pins.

Another example can be the previously described example method, wherein the one or more sockets include a majority of all sockets with which a land grid array including the land grid array pad is configured to be compatible.

Another example can be any of the previously described example methods, wherein the one or more sockets include all sockets with which a land grid array including the land grid array pad is configured to be compatible.

Another example can be any of the previously described example methods, wherein the one or more sockets include a plurality of different socket and pin configurations.

Another example can be any of the previously described example methods, wherein the initial landing area has dimensions causing an entirety of a landing surface of the one or more socket pins to land off of the initial landing area prior to actuation of one or more sockets including the one or more socket pins.

FIG. 1 is a flow diagram of an example method 100 for dimensioning a land grid array pad. As illustrated in FIG. 1, step 102 can include forming an initial landing area of a land grid array pad. For example, step 102 can include forming an initial landing area of a land grid array pad, wherein the initial landing area is dimensioned to cause at least a majority of a landing surface of one or more socket pins to land off of the initial landing area prior to actuation of one or more sockets including the one or more socket pins.

The term "land grid array pad," as used herein, can generally refer to an electrical contact. For example, and without limitation, the land grid array pad can be a pad provided to a LGA socket. The land grid array pad, for example, can be an electrical contact in a grid of such contacts in a land grid array package. For example, and without limitation, an LGA pad can refer to one of the "lands" of a land grid array package that connects to a printed circuit board (PCB) with the aid of solder paste that is typically printed on the PCB.

The term "socket," as used herein, can generally refer to an electrical component of a land grid array package that provides compressive electrical interconnect between a printed circuit board (PCB) and a processor. For example, and without limitation, a land grid array socket can offer a more durable CPU as the contact pins are on the motherboard socket. In contrast, a pin grid array (PGA) socket offers a more durable motherboard as the pins are on the processor. LGA pins are smaller than PGA pins and hence, the LGA socket offers more space efficiency. In this context, the term "socket pin," as used herein, can generally refer to contact pins of a land grid array socket.

The term "landing area," as used herein, can generally refer to a region of a land grid array pad. For example, and without limitation, a landing area can refer to a region of a land grid array pad that comes into contact with a socket pin when a land grid array and a land grid array socket are coupled to one another. In this context, the term "final landing area," can generally refer to an area of a land grid array pad with which a socket pin rests in contact when actuation of a land grid array socket is complete. Also in this context, term "initial landing area," as used herein, can generally refer to an area of a land grid array pad that comes into contact with a socket pin before and/or during actuation of a land grid array socket. In some examples, initial and final landing areas can encompass initial and final landing locations for a variety of different socket and pin configurations with which a land grid array is configured to be compatible.

Step 102 can be performed in a variety of ways. In some examples, the initial landing area can be dimensioned to have a reduced length (e.g., in a wipe direction) compared to an initial landing area of a legacy land grid array pad. In some examples, the initial landing area can have dimensions causing an entirety of a landing surface of the one or more socket pins to land off of the initial landing area prior to actuation of one or more sockets including the one or more socket pins (e.g., initially land entirely off). In some of these examples, a first socket pin of a first socket having a first socket and pin configuration (e.g., a first type of legacy socket, a first socket model manufactured by a first socket supplier, etc.) can have a first landing surface configured to land entirely off of the initial landing area prior to actuation of the first socket including the first socket pin. In some of these examples, a second socket pin of a second socket having a second socket and pin configuration (e.g., a second type of legacy socket, a second socket model manufactured by a second socket supplier, etc.) can have a second landing surface configured to land at least partially on the initial landing area prior to actuation of the second socket including the second socket pin (e.g., initially land at least partially on). In some of these examples, the second landing surface of the second socket pin can initially land entirely on the initial landing area, initially land predominantly on the initial landing area, or initially land predominantly off of the initial landing area.

In some of the examples above, a third socket pin of a third socket having a third socket and pin configuration (e.g., a third type of legacy socket, a third socket model manufactured by a third socket supplier, etc.) can have a third landing surface configured to land at least partially on the initial landing area prior to actuation of the third socket including the third socket pin (e.g., initially land at least partially on). For example, the first landing surface of the first socket pin can initially land entirely off of the initial landing area, the second landing surface of the second socket pin can initially land predominantly off of the initial landing area, and the third landing surface of the third socket pin can initially land predominantly on or entirely on the initial landing area. In some of these examples, a fourth socket pin of a fourth socket having a fourth socket and pin configuration (e.g., a fourth type of legacy socket, a fourth socket model manufactured by a fourth socket supplier, etc.) can have a fourth landing surface configured to land at least partially on the initial landing area prior to actuation of the fourth socket including the fourth socket pin (e.g., initially land at least partially on). For example, the first landing surface of the first socket pin can initially land entirely off of the initial landing area, the second landing surface of the second socket pin can initially land predominantly off of the initial landing area, the third landing surface of the third socket pin can initially land predominantly on the initial landing area, and the fourth landing surface of the fourth socket pin can initially land entirely on the initial landing area.

In other examples, no landing surfaces of any of the socket pins can land entirely off of the initial landing area, and at least one of the landing surfaces of at least one of the socket pins can initially land predominantly off of the initial landing area (e.g., at least a majority of the landing surface of at least one of the socket pins initially lands off of the initial landing area). In any of the above examples, the one or more sockets can include a majority of all sockets with which a land grid array including the land grid array pad is configured to be compatible. Additionally or alternatively, the one or more sockets can include all sockets with which a land grid array including the land grid array pad is configured to be compatible. Additionally or alternatively, the one or more sockets can include a plurality of different socket and pin configurations (e.g., various types of legacy sockets, various socket models manufactured by different socket suppliers, etc.).

Step 104 can include forming a final landing area of the land grid array pad. For example, step 104 can include forming a final landing area of the land grid array pad, wherein the final landing area is dimensioned to maintain electrical contact with the landing surface of the one or more socket pins after actuation of the one or more sockets including the one or more socket pins.

Step 104 can be performed in a variety of ways. In one example, the final landing area can be dimensioned in a same manner as a final landing area of a legacy land grid array pad. Alternatively, the final landing area can be dimensioned to have a reduced length (e.g., in a wipe direction) compared to a final landing area of a legacy land grid array pad. In such examples, a reduction in length of the final landing area can be different from a reduction in length of the initial landing area, so that the reductions in lengths of the two areas are asymmetrical. Additional details relating to determining the dimensions of the initial and/or final landing areas are provided below with reference to FIG. 2.

Figure 2:
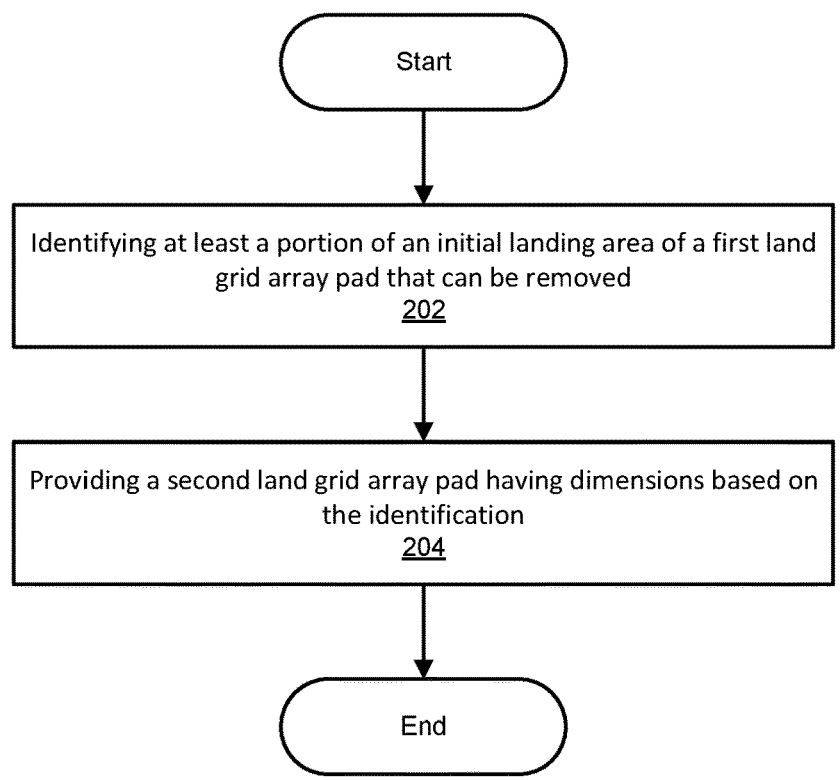
FIG. 2 is a flow diagram of an example method for determining dimensions for a land grid array pad.

FIG. 2 is a flow diagram of an example method 200 for determining dimensions for a land grid array pad. As illustrated in FIG. 2, step 202 can include identifying a portion of an initial landing area of a land grid array pad. For example, step 102 can include identifying at least a portion of an initial landing area of a first land grid array pad that can be removed.

Step 202 can be performed in a variety of ways. In some examples, identifying at least the portion of the initial landing area at step 202 can include analyzing a first location of a socket pin on the first land grid array pad before a socket including the socket pin is actuated. In some of these examples, identifying at least the portion of the initial landing area can further include analyzing a second location of the socket pin on the first land grid array pad after the socket including the socket pin is actuated. In some of these examples, identifying at least the portion of the initial landing area can further include comparing the first location and the second location. In some of these examples, identifying at least the portion of the initial landing area can further include analyzing the first location, analyzing the second location, and performing the comparison for a plurality of different socket and pin configurations (e.g., various types of legacy sockets, various socket models manufactured by different socket suppliers, etc.). In any of the above examples, identifying at least the portion of the initial landing area at step 202 can include identifying the portion of the initial landing area that can be removed without compromising structural integrity of or electrical connectivity to a final landing area of the second land grid array pad.

Step 204 can include providing another land grid array pad. For example, step 104 can include providing a second land grid array pad having dimensions based on the identification.

Step 204 can be performed in a variety of ways. For example, providing the second land grid array pad at step 204 can include providing a semiconductor device package substrate having an array of instances of the second land grid array pad on a side thereof. In some of these examples, providing a semiconductor device package substrate can include arranging a first plurality of land grid array pads on a first surface region of the side of the semiconductor device package substrate, and arranging a second plurality of land grid array pads on a second surface region of the side of the semiconductor device package substrate. In some of these examples, land grid array pads of the first plurality of land grid array pads and the second plurality of land grid array pads can have initial landing areas and final landing areas. In some of these examples, the initial landing areas can have dimensions causing at least a majority of landing surfaces of a plurality of socket pins to land off of the initial landing areas prior to actuation of one or more sockets including the plurality of socket pins. In some of these examples, the final landing areas can have dimensions configured to maintain electrical contact with the landing surfaces of the plurality of socket pins after actuation of the one or more sockets including the plurality of socket pins. In any of the above examples, the initial landing areas can have dimensions causing entireties of landing surfaces of the plurality of socket pins to land off of the initial landing areas prior to actuation of the one or more sockets including the plurality of socket pins.

Figure 3:
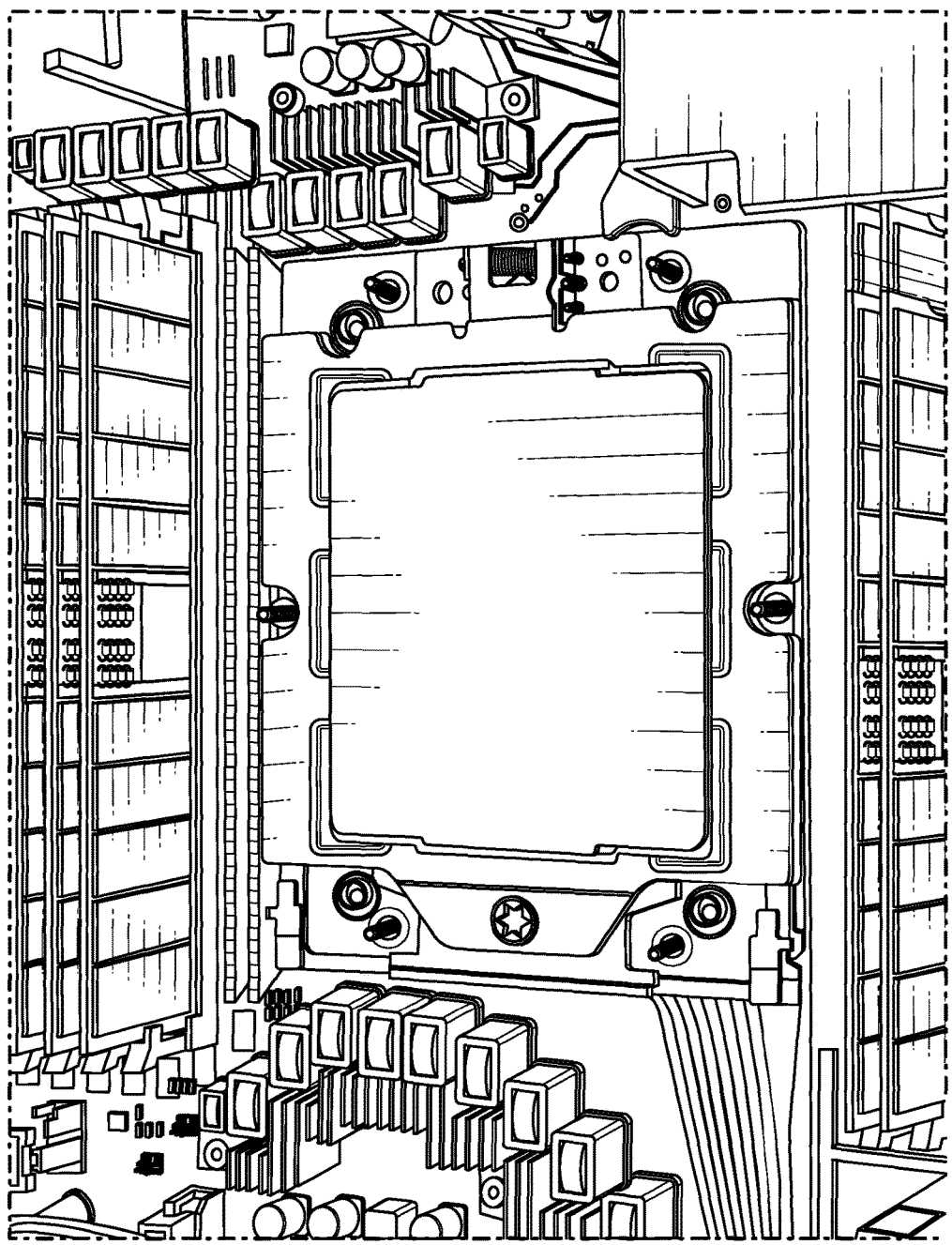
FIG. 3 is a top view of a semiconductor device package inserted in a land grid array socket.
Figure 4:
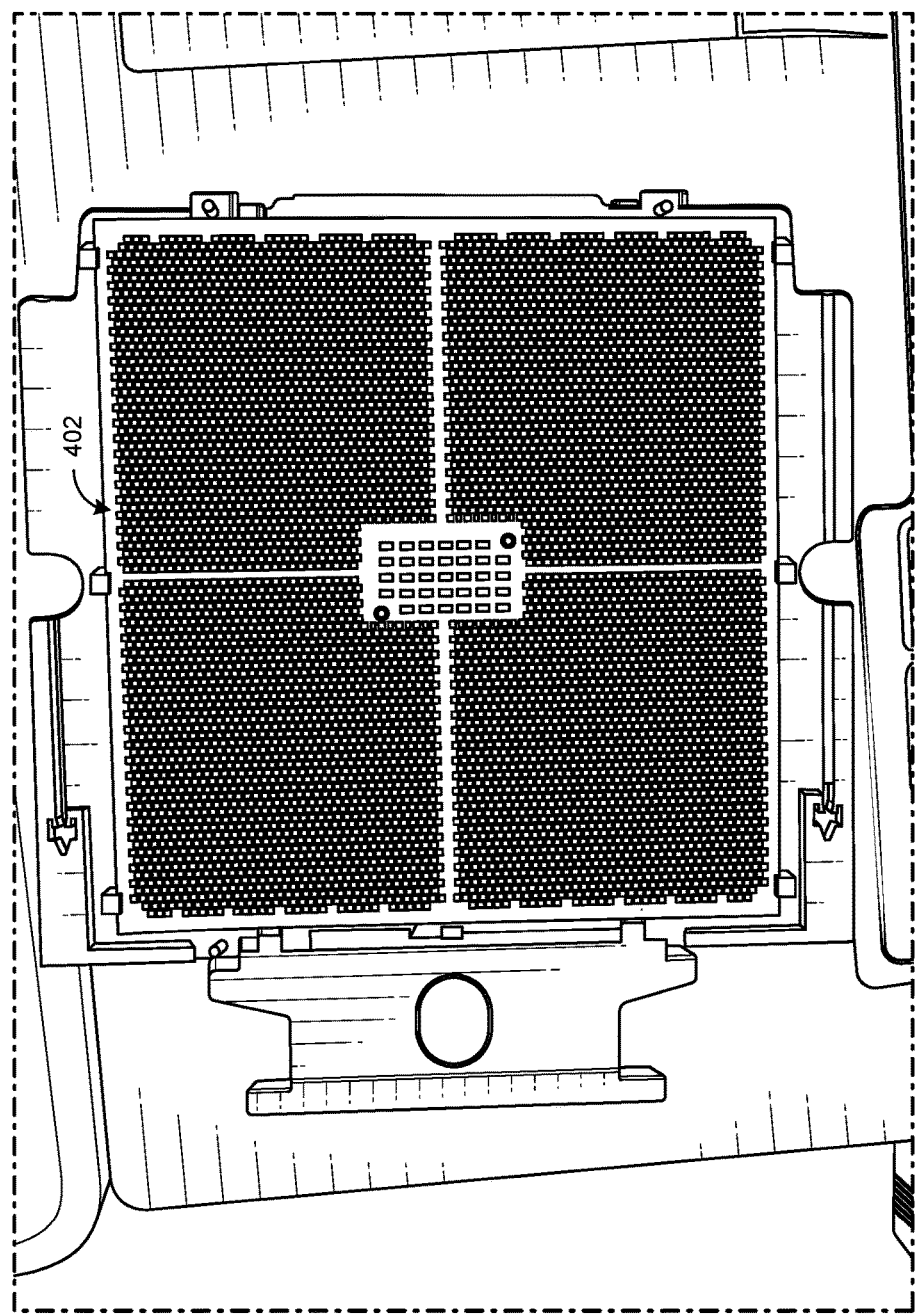
FIG. 4 is a top view of a land grid array on a back side of a semiconductor device package substrate.
Figure 5:
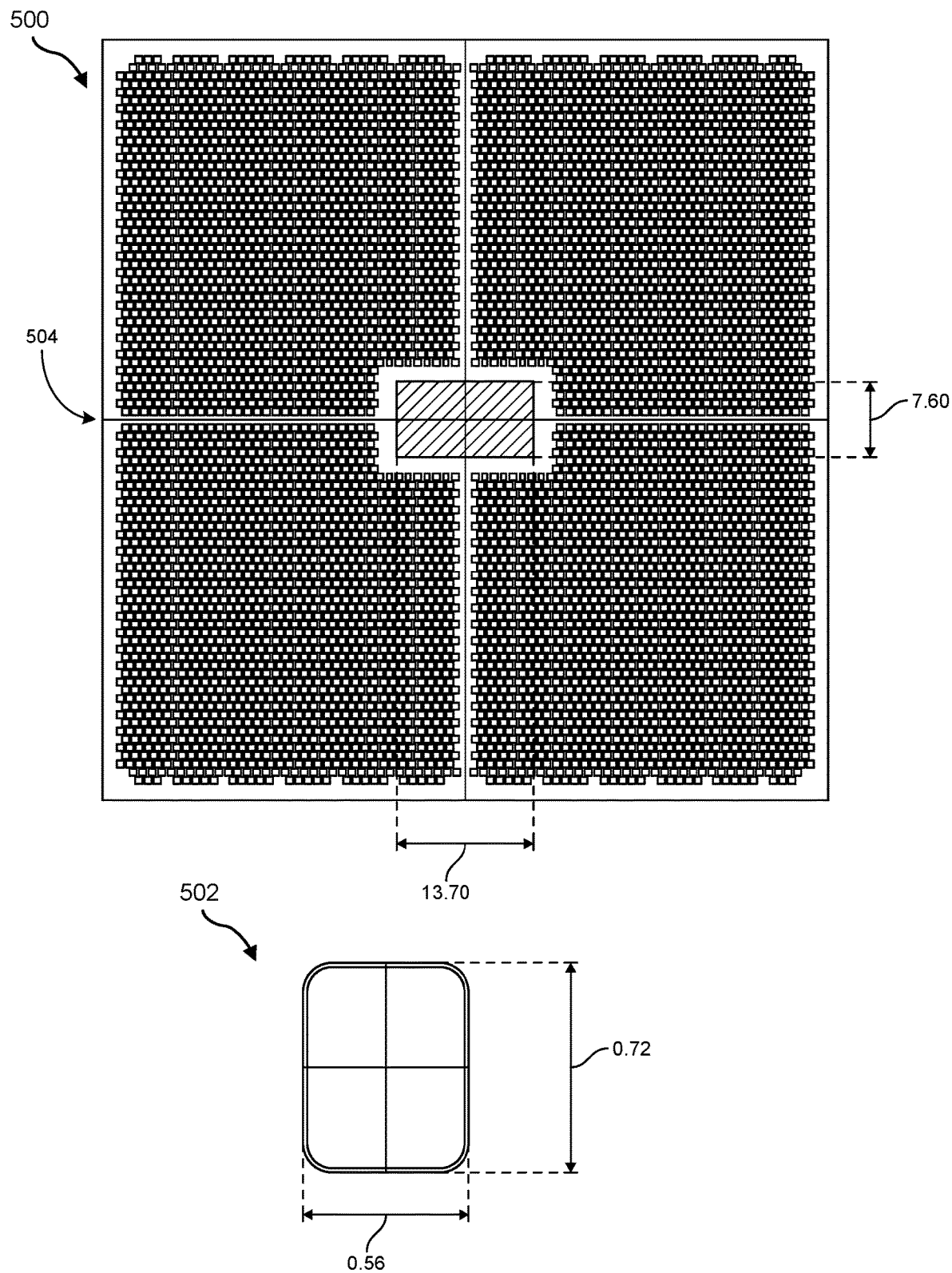
FIG. 5 is a diagram illustrating example land grid array dimensions and example land grid array pad dimensions.

FIG. 3 is a top view of a semiconductor device package inserted in a land grid array socket 300. As shown in FIG. 4, removal of a socket cover can reveal the semiconductor device package substrate 400 having a land grid array 402 on a back side thereof. FIG. 5 illustrates example land grid array dimensions 500 and example land grid array pad dimensions 502. A center line 504 of the land grid array can divide land grid array pads into separate surface regions of the substrate. Socket pins can initially land on top edges of land grid array pads located in a top region and on bottom edges of land grid array pads located in a bottom region. These socket pins can be configured to wipe towards the center line when the socket is actuated by, for example, securing the socket cover atop the semiconductor device package substrate.

Figure 6A:
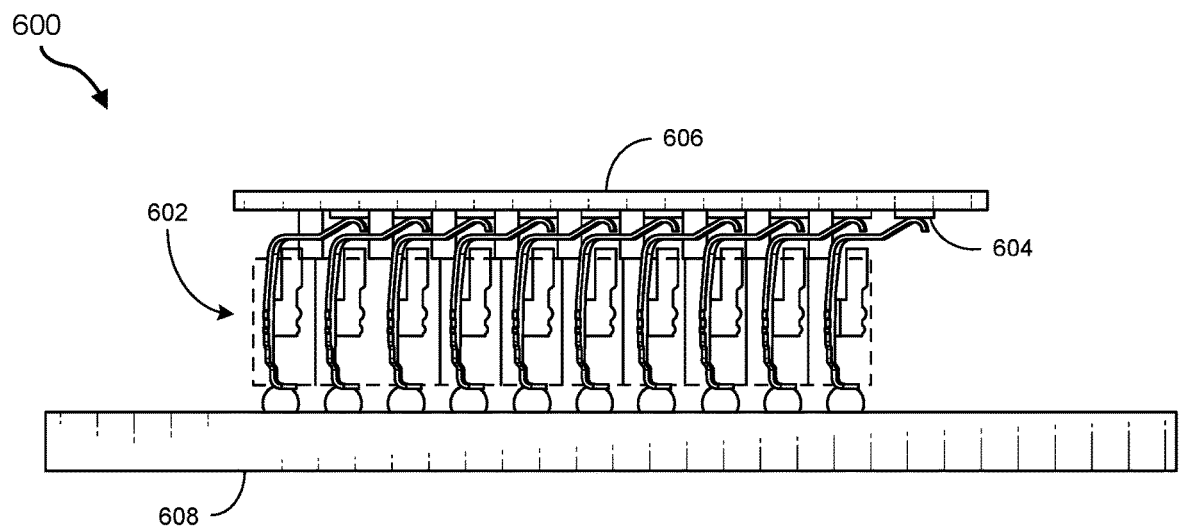
FIG. 6A is a side view of an example socket including example socket pins contacting final landing areas of land grid array pads following actuation of the example socket.
Figure 6B:
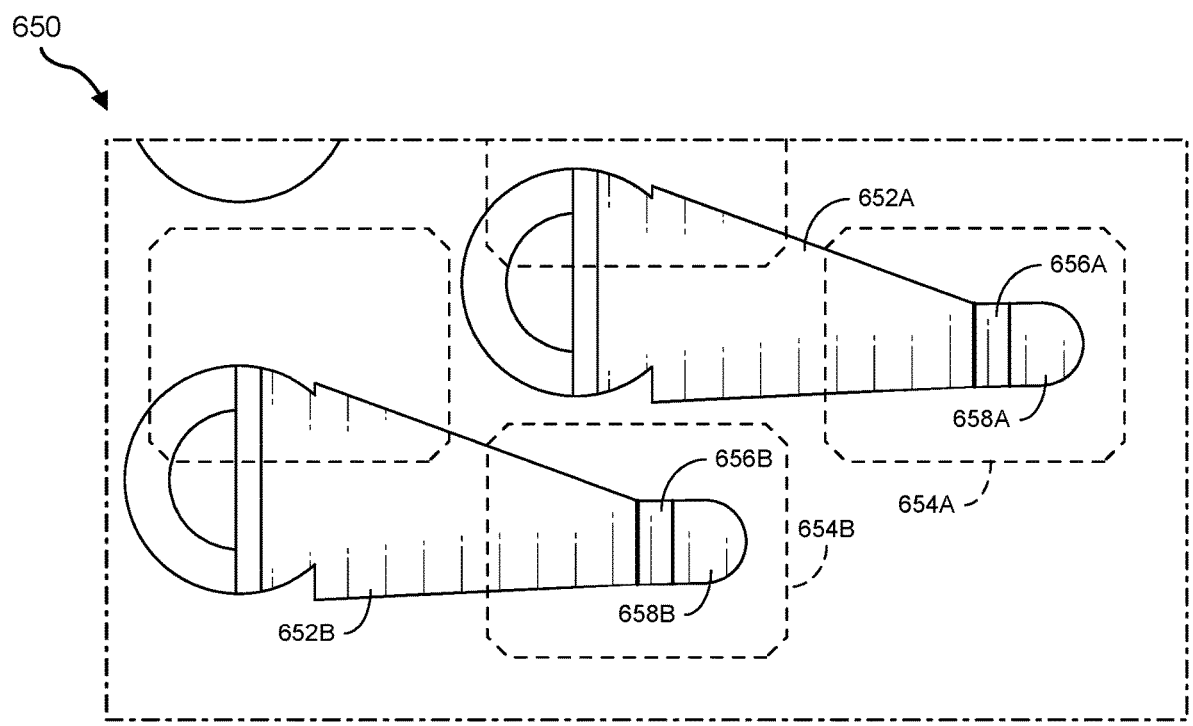
FIG. 6B is a top view of example socket pins contacting final landing areas of land grid array pads following actuation of the example socket of FIG. 6A.

FIG. 6A is a side view of an example socket 600 including example socket pins 602 contacting final landing areas of land grid array pads 604 arranged on a semiconductor device package substrate 606 following actuation of the example socket 600 by securing cover 608. FIG. 6B is a top view of a surface region 650 of semiconductor device package substrate 606 with example socket pins 652A and 652B contacting final landing areas of land grid array pads 654A and 654B following actuation of the example socket 600 of FIG. 6A. Socket pins 652A and 652B can be configured with landing surfaces 656A and 656B and angled tips 658A and 658B. The landing surfaces 656A and 656B of the one or more socket pins can maintain contact with the final landing areas of land grid array pads 654A and 654B after actuation of the one or more sockets including the one or more socket pins. Angled tips 658A and 658B can be angled to extend away from the pad and, thus, can avoid contacting the final landing areas of land grid array pads 654A and 654B.

Figure 7A:
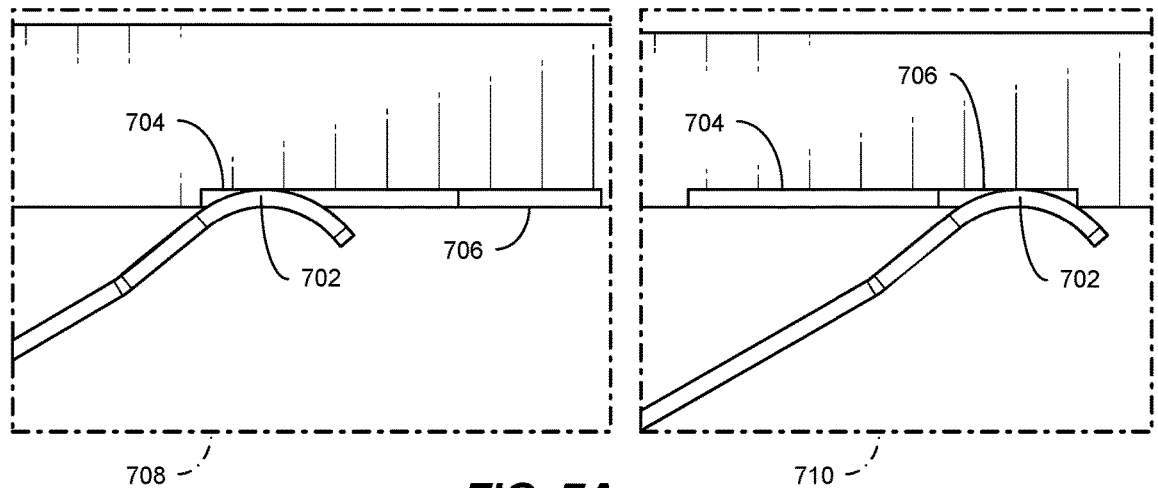
FIG. 7A is a side view of an example socket pin contacting an initial landing area and a final landing area of a land grid array pad before and after actuation of an example socket.

FIG. 7A is a side view 700 of an example socket pin 702 contacting an initial landing area 704 and a final landing area 706 of a land grid array pad before, at 708, and after, at 710, actuation of an example socket. A landing surface of socket pin 702 can wipe across initial landing area 704 to final landing area 706 during socket actuation. The angled tip of socket pin 702 can achieve reduced friction and avoid damaging the land grid array pad by keeping a front edge of socket pin 702 away from a surface of the land grid array pad during socket actuation.

Figure 7B:
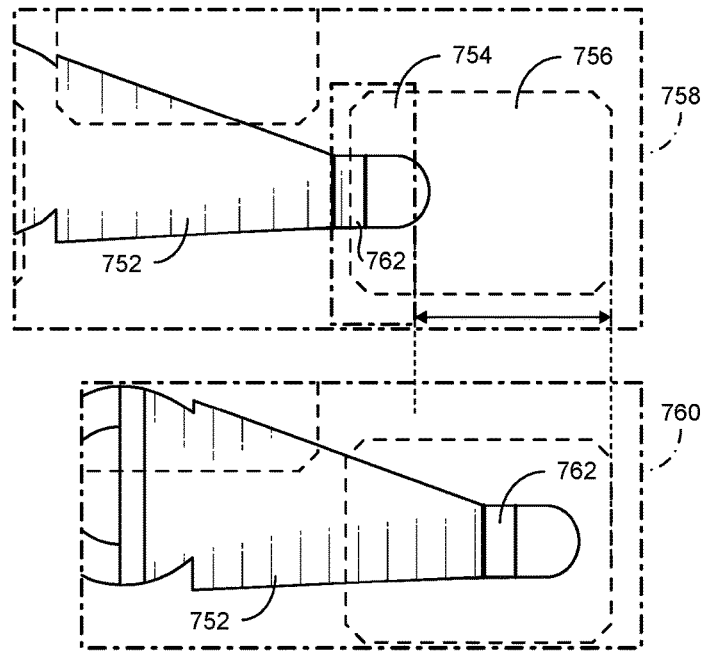
FIG. 7B is a top view 750 of an example socket pin contacting an initial landing area and a final landing area of a land grid array pad before and after actuation of an example socket.

FIG. 7B is a top view 750 of an example socket pin 752 contacting an initial landing area 754 and a final landing area 756 of a land grid array pad before, at 758, and after, at 760, actuation of an example socket. Comparing FIGS. 7A and 7B, a landing surface of socket pin 702 initially lands entirely on the initial landing area 704 and finally lands near a far edge of the final landing area 706. In contrast, the landing surface 762 of socket pin 752 initially lands partially on the initial landing area 754 (e.g., at least a majority of the landing surface on the initial landing area) and finally lands near a center of the final landing area 756. Even when the land grid array pads and locations thereof are identical, this type of variation can occur with different socket and pin configurations (e.g., different types of legacy sockets, different socket models manufactured by different socket suppliers, etc.).

Figure 8:
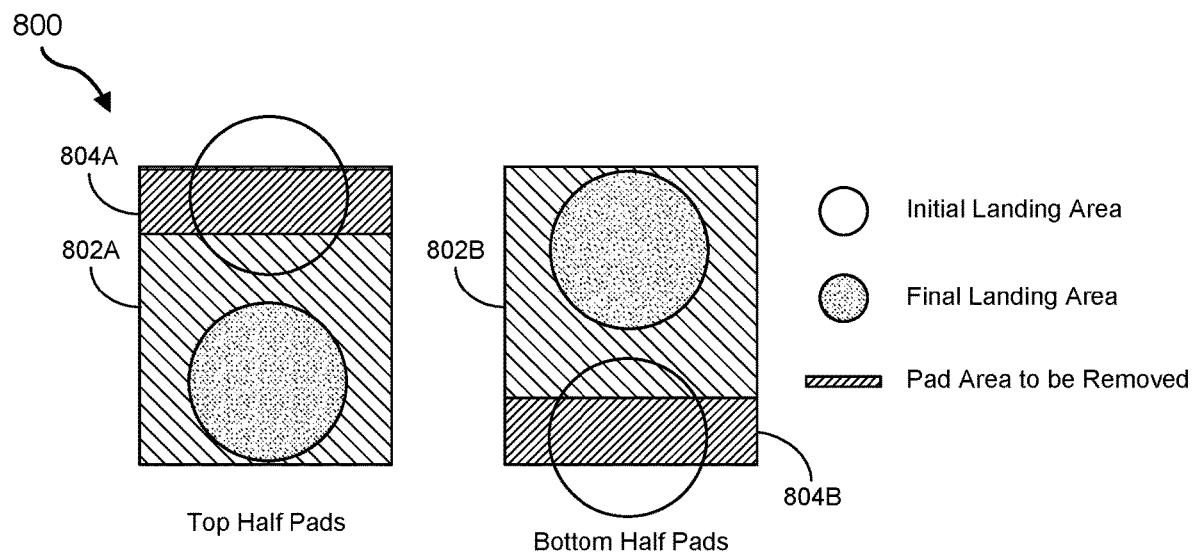
FIG. 8 is a top view of example land grid array pads for which new dimensions are determined according to the method of FIG. 2.
Figure 8:
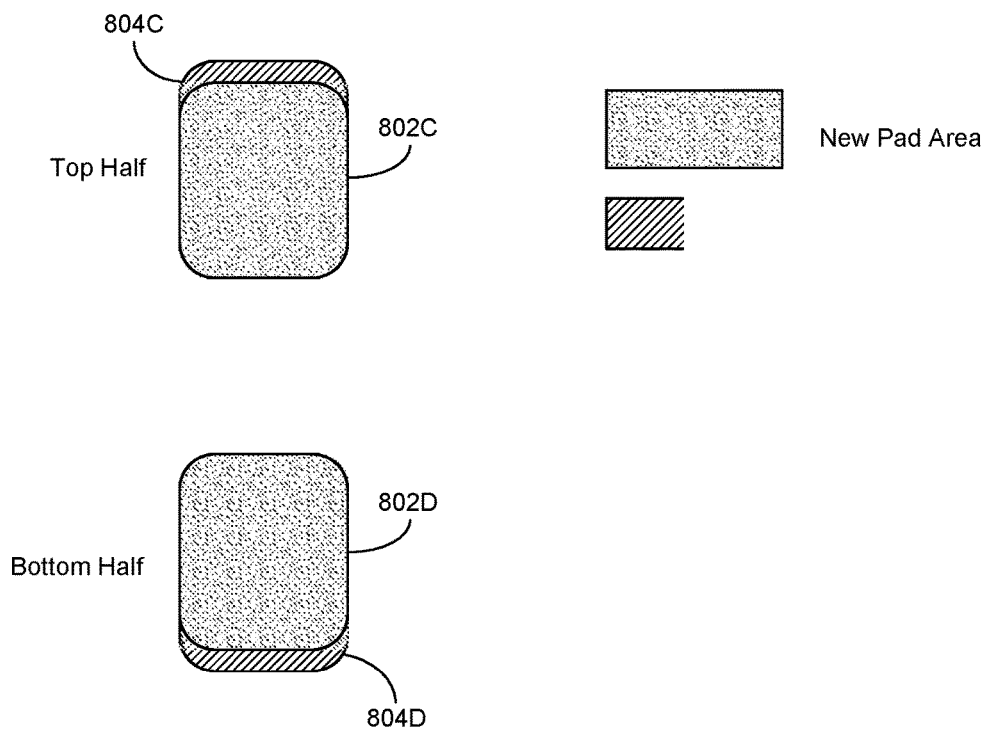

FIG. 8 is a top view 800 of example land grid array pads 802A-802D for which new dimensions are determined according to the method of FIG. 2. Land grid array pads 802A and 802C can be arranged on a top surface region of a side of a semiconductor device package substrate and land grid array pads 802B and 802D can be arranged on a top surface region of a side of a semiconductor device package substrate. Various types of sockets with which land grid array pads 802A-802D are configured to be compatible can have socket pins designed to wipe towards a center line of the land grid array. In such examples, initial landing areas can be located at top edges of pads 802A and 802C, and initial landing areas can be located at bottom edges of pads 802B and 802D. Likewise, final landing areas can be located near bottom edges of pads 802A and 802C, and final landing areas can be located near top edges of pads 802B and 802D. Application of method 200 of FIG. 2 can identify these initial and final landing areas for one or more socket and pin configurations (e.g., one or more types of legacy sockets, one or more socket models manufactured by one or more socket suppliers, etc.). Identifying these initial and final landing areas for more than one socket and pin configuration (e.g., more than one type of legacy socket, more than one socket model manufactured by more than one socket supplier, etc.) can enable identification of portions 804A-804D of the initial landing areas of pads 802A-802D that can be removed while maintaining compatibility with more than one socket configuration. For example, portions 804A and 804C can be located at top edges of pads 802A and 802C, and portions 804B and 804D can be located at bottom edges of pads 802B and 802D. Determinations of these portions 804A-804D can enable determination of dimensions for land grid array pads having pad areas that are reduced compared to those of pads 802A-802D.

Figure 9:
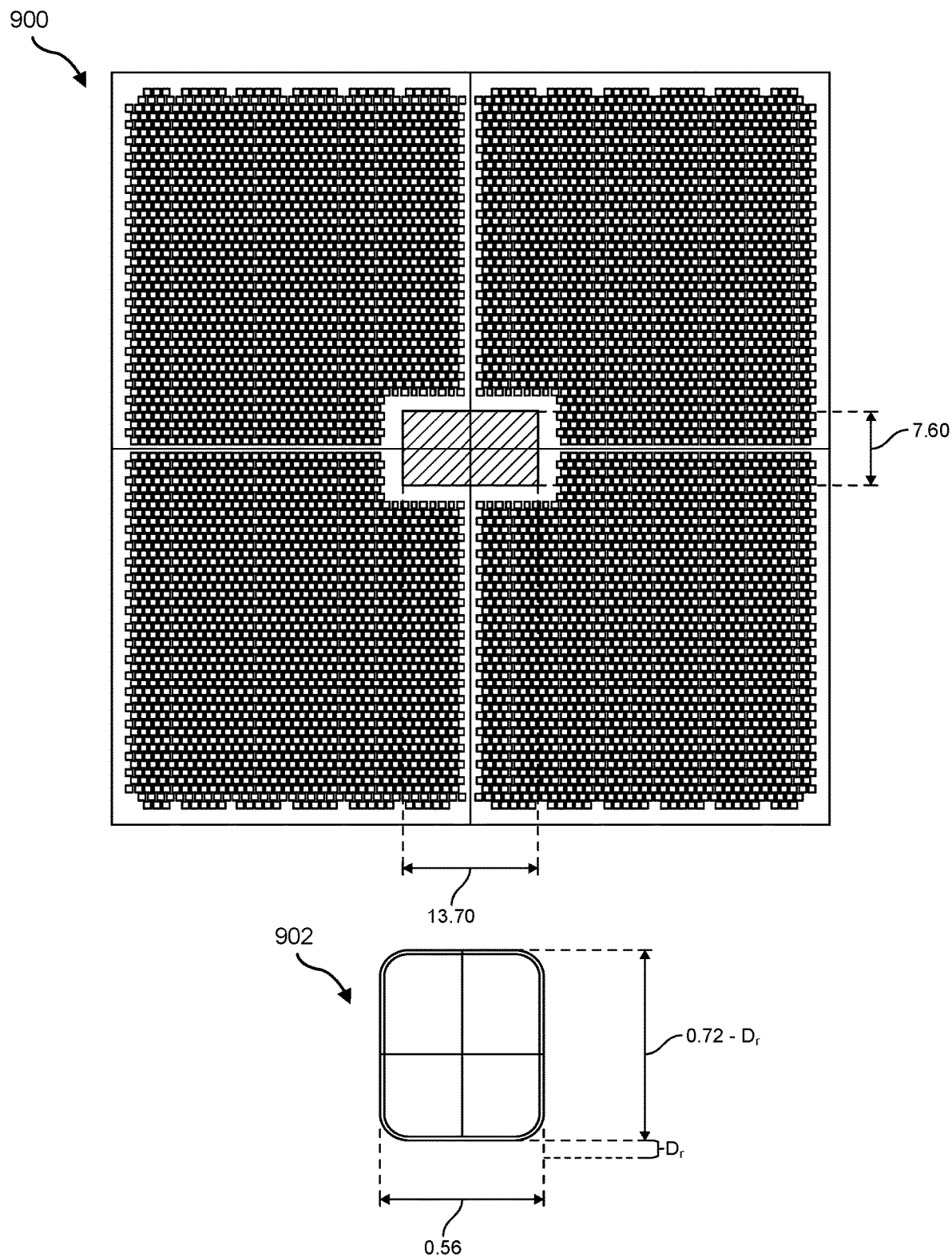
FIG. 9 is a diagram illustrating example land grid array dimensions and example land grid array pad dimensions according to the method of FIG. 1.

FIG. 9 is a diagram illustrating example land grid array dimensions 900 and example land grid array pad dimensions 902 according to the method of FIG. 1. In order to maintain compatibility with various socket and pin configurations, the land grid array dimensions 900 (e.g., size, shape, land grid array pad location, etc.) can be the same as land grid array dimensions 500 of FIG. 5. However, land grid array pad dimensions 902 can be reduced compared to land grid array pad dimensions 502 of FIG. 5. An dimension of reduction Dr by which a length and/or width of the pad is reduced can correspond to a length and/or width of identified portions 804A-804D of FIG. 8. Accordingly, dimensions 902 can correspond to the dimensions determined with reference to FIG. 8.

Figure 10A:
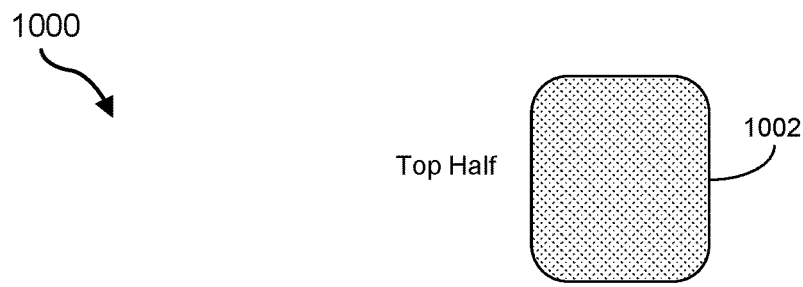
FIG. 10A is a top view of example land grid array pads dimensioned according to the method of FIG. 1.
Figure 10A:
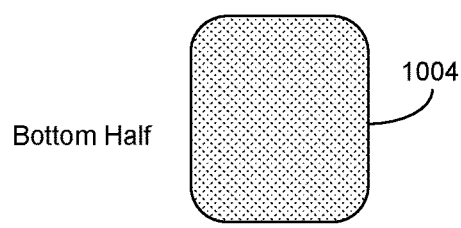

FIG. 10A is a top view of example land grid array pads 1000 dimensioned according to the method of FIG. 1. For example, a land grid array pad 1002 located on a bottom half of a land grid array can have dimensions 902 as shown in FIG. 9 that are reduced in an initial landing area located at a bottom edge of the pad 1002. Similarly, a land grid array pad 1004 located on a top half of the land grid array can have dimensions 902 as shown in FIG. 9 that are reduced in an initial landing area located at a top edge of the pad 1004.

Figure 10B:
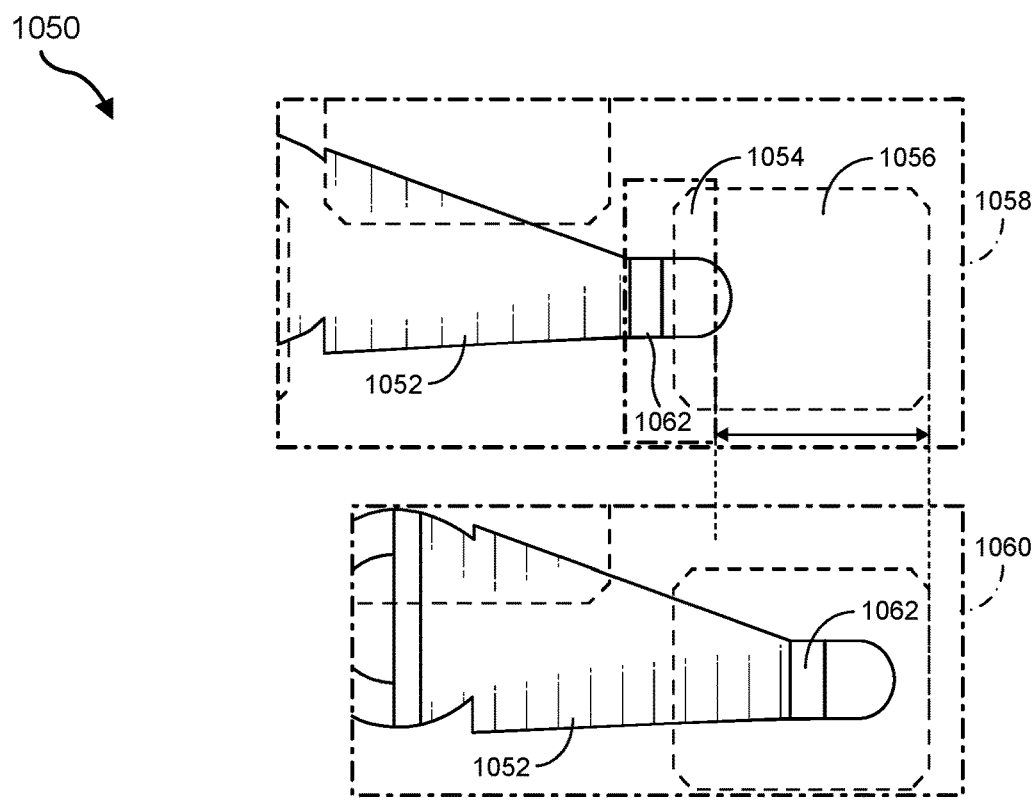
FIG. 10B is a top view of an example socket pin contacting an initial landing area and a final landing area of a land grid array pad dimensioned according to the disclosed techniques both before and after actuation of an example socket.

FIG. 10B is a top view 1050 of an example socket pin 1052 contacting an initial landing area 1054 and a final landing area 1056 of a land grid array pad before, at 1058, and after, at 1060, actuation of an example socket. Comparing FIGS. 10B and 7B, the landing surface 762 of socket pin 752 initially lands partially on the initial landing area 754 (e.g., at least a majority of the landing surface on the initial landing area) and finally lands near a center the final landing area 756. In contrast, a landing surface 1062 of socket pin 1052 initially lands entirely off of an initial landing area 1054 and finally lands near a center the final landing area 1056. This type of difference between the disclosed landing pad and a legacy landing pad can be observed even when socket pins 752 and 1052 are identical and are part of a same socket and pin configuration.

As set forth above, a land grid array pad can be formed so that an initial landing area of the pad is dimensioned to cause at least a majority of a landing surface of one or more socket pins to land off of the initial landing area prior to actuation of one or more sockets including the one or more socket pins. Additionally, the land grid array pad can be formed so that a final landing area is dimensioned to maintain electrical contact with the landing surface of the one or more socket pins after actuation of the one or more sockets including the one or more socket pins. In some implementations, all final landing areas of all land grid array pads of a land grid array can be dimensioned to maintain electrical contact with landing surfaces of all socket pins of a socket after actuation of the socket. By reducing the initial landing area so that some socket pins of some types of sockets can initially land off of (e.g., mostly off of and/or entirely off of) the land grid array pad, dimensions of the land grid array pad can be reduced while still being compatible with various socket and pin configurations provided by different socket suppliers (e.g., a variety of legacy sockets and/or future socket designs). Reduction of the land grid array pad dimensions in this manner allows for reduction of a corresponding anti-pad in the semiconductor device package without impacting socket-CPU interaction, thus reducing parasitic capacitance (e.g., capacitive load) and, consequently, improving semiconductor device functionality.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various implementations have been described and/or illustrated herein in the context of fully functional computing systems, one or more of these example implementations can be distributed as a program product in a variety of forms, regardless of the particular type of computer-readable media used to actually carry out the distribution. The implementations disclosed herein can also be implemented using modules that perform certain tasks. These modules can include script, batch, or other executable files that can be stored on a computer-readable storage medium or in a computing system. In some implementations, these modules can configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A land grid array pad comprising:
   an initial landing area dimensioned to cause at least a majority of a landing surface of one or more socket pins to land off of the initial landing area prior to actuation of one or more sockets including the one or more socket pins; and a final landing area dimensioned to maintain electrical contact with the landing surface of the one or more socket pins after actuation of the one or more sockets including the one or more socket pins.

2. The land grid array pad of claim 1, wherein the one or more sockets include a majority of all sockets with which a land grid array including the land grid array pad is configured to be compatible.

3. The land grid array pad of claim 1, wherein the one or more sockets include all sockets with which a land grid array including the land grid array pad is configured to be compatible.

4. The land grid array pad of claim 1, wherein the one or more sockets include a plurality of different socket and pin configurations.

5. The land grid array pad of claim 1, wherein the initial landing area has dimensions causing an entirety of a landing surface of the one or more socket pins to land off of the initial landing area prior to actuation of one or more sockets including the one or more socket pins.

6. The land grid array pad of claim 5, wherein the one or more sockets include a majority of all sockets with which a land grid array including the land grid array pad is configured to be compatible.

7. The land grid array pad of claim 5, wherein the one or more sockets include all sockets with which a land grid array including the land grid array pad is configured to be compatible.

8. The land grid array pad of claim 5, wherein the one or more sockets include a plurality of different socket and pin configurations.

9. The land grid array pad of claim 1, wherein the land grid array pad is arranged in a land grid array on a first surface region of a side of a semiconductor device package substrate, the land grid array includes an additional land grid array pad arranged on a second surface region of the side of the semiconductor device package substrate, and the additional land grid array pad includes an additional initial landing area having dimensions causing at least a majority of a landing surface of an additional socket pin of the one or more socket pins to land off of the additional initial landing area prior to actuation of the one or more sockets.

10. A land grid array, comprising:
 a first plurality of land grid array pads arranged on a first surface region of a side of a semiconductor device package substrate; and
 a second plurality of land grid array pads arranged on a second surface region of the side of the semiconductor device package substrate,
 wherein land grid array pads of the first plurality of land grid array pads and the second plurality of land grid array pads have initial landing areas and final landing areas, the initial landing areas have dimensions causing at least a majority of landing surfaces of a plurality of socket pins to land off of the initial landing areas prior to actuation of one or more sockets including the plurality of socket pins, and the final landing areas have dimensions configured to maintain electrical contact with the landing surfaces of the plurality of socket pins after actuation of the one or more sockets including the plurality of socket pins.

11. The land grid array of claim 10, wherein the plurality of socket pins includes:
 a first set of socket pins configured to wipe, by actuation of the one or more sockets, in a first direction onto final landing areas of the first plurality of land grid array pads; and
 a second set of socket pins configured to wipe, by actuation of the one or more sockets, in a second direction opposite the first direction onto final landing areas of the second plurality of land grid array pads.

12. The land grid array of claim 10, wherein the one or more sockets include a majority of all sockets with which the land grid array is configured to be compatible.

13. The land grid array of claim 10, wherein the one or more sockets include all sockets with which the land grid array is configured to be compatible.

14. The land grid array of claim 10, wherein the one or more sockets include a plurality of different socket and pin configurations.

15. The land grid array of claim 10, wherein the initial landing areas have dimensions causing entireties of landing surfaces of the plurality of socket pins to land off of the initial landing areas prior to actuation of the one or more sockets including the plurality of socket pins.

16. A method comprising:
 forming an initial landing area of a land grid array pad, wherein the initial landing area is dimensioned to cause at least a majority of a landing surface of one or more socket pins to land off of the initial landing area prior to actuation of one or more sockets including the one or more socket pins; and
 forming a final landing area of the land grid array pad, wherein the final landing area is dimensioned to maintain electrical contact with the landing surface of the one or more socket pins after actuation of the one or more sockets including the one or more socket pins.

17. The method of claim 16, wherein the one or more sockets include a majority of all sockets with which a land grid array including the land grid array pad is configured to be compatible.

18. The method of claim 16, wherein the one or more sockets include all sockets with which a land grid array including the land grid array pad is configured to be compatible.

19. The method of claim 16, wherein the one or more sockets include a plurality of different socket and pin configurations.

20. The method of claim 16, wherein the initial landing area has dimensions causing an entirety of a landing surface of the one or more socket pins to land off of the initial landing area prior to actuation of one or more sockets including the one or more socket pins.

* * * * *